United States Patent
He

(10) Patent No.: US 6,783,375 B2
(45) Date of Patent: Aug. 31, 2004

(54) ELECTRICAL CONNECTOR WITH IMPROVED TERMINALS

(75) Inventor: Wen He, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/175,932

(22) Filed: Jun. 19, 2002

(65) Prior Publication Data

US 2003/0216076 A1 Nov. 20, 2003

(30) Foreign Application Priority Data

May 17, 2002 (TW) .................................... 91207062 U

(51) Int. Cl.⁷ .............................................. H01R 12/00
(52) U.S. Cl. ........................ 439/83; 439/342; 439/876
(58) Field of Search ........................... 439/83, 342, 876

(56) References Cited

U.S. PATENT DOCUMENTS 5,489,218 A * 2/1996 McHugh ..................... 439/342
5,997,317 A * 12/1999 Pei et al. ..................... 439/83
6,099,326 A * 8/2000 Lin .............................. 439/83
6,217,348 B1 * 4/2001 Lin et al. ..................... 439/83
6,527,577 B1 * 3/2003 Chen et al. ................ 439/342

* cited by examiner

Primary Examiner—Gary Paumen
(74) Attorney, Agent, or Firm—Wei Te Chung

(57) ABSTRACT

An electrical connector (1) for electrically connecting a central processing unit (CPU) with a printed circuit board (PCB). The connector includes a base (2), and a cover (3) slidably engaged on the base. The base includes a body (21), and a multiplicity of holes (211) defined through the body. The holes are arranged in a rectangular array, and retain a multiplicity of terminals (22) therein. Each terminal includes a solder portion (223) adapted to receive a solder ball (224) fused thereon. A curved dimple (2232) is defined in a middle of a bottom of the solder portion. A largest cross-sectional area of the dimple is slightly less than an area of the solder portion.

13 Claims, 3 Drawing Sheets

ELECTRICAL CONNECTOR WITH IMPROVED TERMINALS

BACKGROUND OF THE INVENTION

1. Field of the Invention

The present invention relates to an electrical connector for electrically connecting a central processing unit (CPU) with a printed circuit board (PCB), and particularly to an electrical connector with improved terminals for soldering to the PCB via solder balls.

2. Description of Related Art

Ball grid array (BGA) sockets are widely used in personal computer (PC) systems to electrically connect CPUs with PCBs. A BGA socket comprises a multiplicity of terminals arranged in a rectangular array, with each terminal having a solder ball attached thereon.

Conventional soldering procedure is: the solder ball is positioned on the terminal, the solder ball is heated and melted, and the terminal is thereby soldered and electrically connected with the PCB. This conventional procedure is disclosed in "BGA sockets: a dendritic solution" (P460–466, 1996 IEEE 46th electronic Components & Technology Conference).

U.S. Pat. No. 5,997,317, Taiwan Patent No. 392975 and China Pat. No. 98252275.4 all disclose an electrical terminal of an electrical connector comprising a contact portion and a solder portion substantially perpendicular to the solder portion. A dimple is defined in a center of a bottom of the solder portion. A width of the dimple is less than a width of the solder portion. A solder ball is held in the dimple.

Conventionally, the width of the dimple is relatively small. Therefore, it is difficult to precisely position the solder ball in the dimple. In addition, the melted solder ball is prone to wick along the terminal of the electrical connector when the solder ball is soldered to the PCB.

In view of the above, a new electrical connector that overcomes the above-mentioned disadvantages is desired.

SUMMARY OF THE INVENTION

Accordingly, an object of the present invention is to provide an electrical connector for electrically connecting a CPU with a PCB, whereby the electrical connector can ensure that solder balls are precisely located on terminals of the electrical connector to prevent the melted solder balls from wicking along the terminals.

To achieve the above-mentioned object, an electrical connector for electrically connecting a CPU with a PCB is provided by the present invention. In a preferred embodiment, the electrical connector comprises a base, and a cover slidably engaged on the base. The base comprises a body, and a multiplicity of holes defined through the body. The holes are arranged in a rectangular array, and retain a multiplicity of terminals therein. Each terminal comprises a solder portion adapted to receive a solder ball fused thereon. A curved dimple is defined in a middle of a bottom of the solder portion. A largest cross-sectional area of the dimple is slightly less than an area of the solder portion.

Other objects, advantages and novel features of the invention will become more apparent from the following detailed description when taken in conjunction with the accompanying drawings, in which:

DETAILED DESCRIPTION OF PREFERRED EMBODIMENTS OF THE INVENTION

Reference will now be made to the drawings to describe the present invention in detail.

Figure 1:
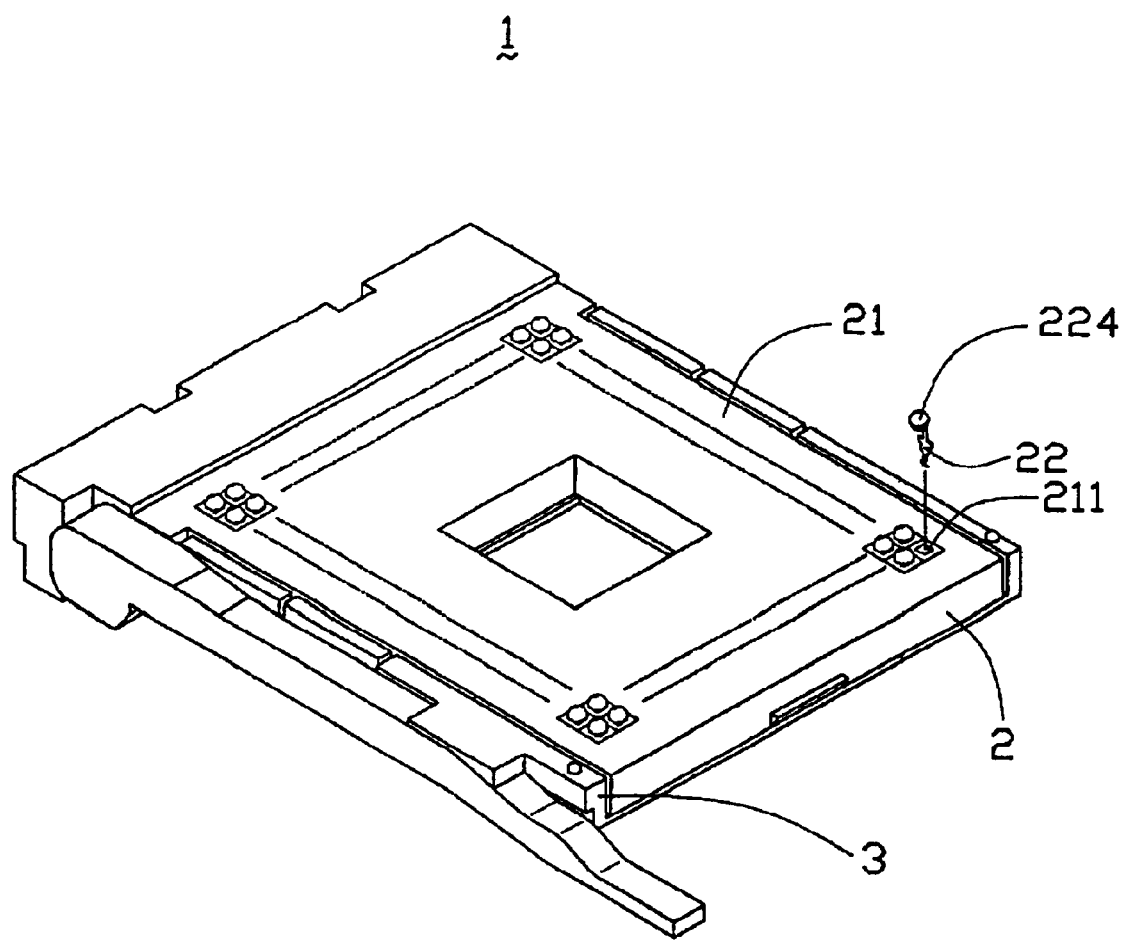
FIG. 1 is an isometric view of an electrical connector in accordance with the present invention, viewed from a bottom aspect and simplified for clarity.

Referring to FIG. 1, an electrical connector 1 in accordance with a preferred embodiment of the present invention comprises a base 2, and a cover 3 slidably engaged on the base 2. The base 2 comprises a body 21, and a multiplicity of holes 211 defined through the body 21. The holes 211 are arranged in a rectangular array, and respectively retain a multiplicity of terminals 22 therein.

Figure 2:
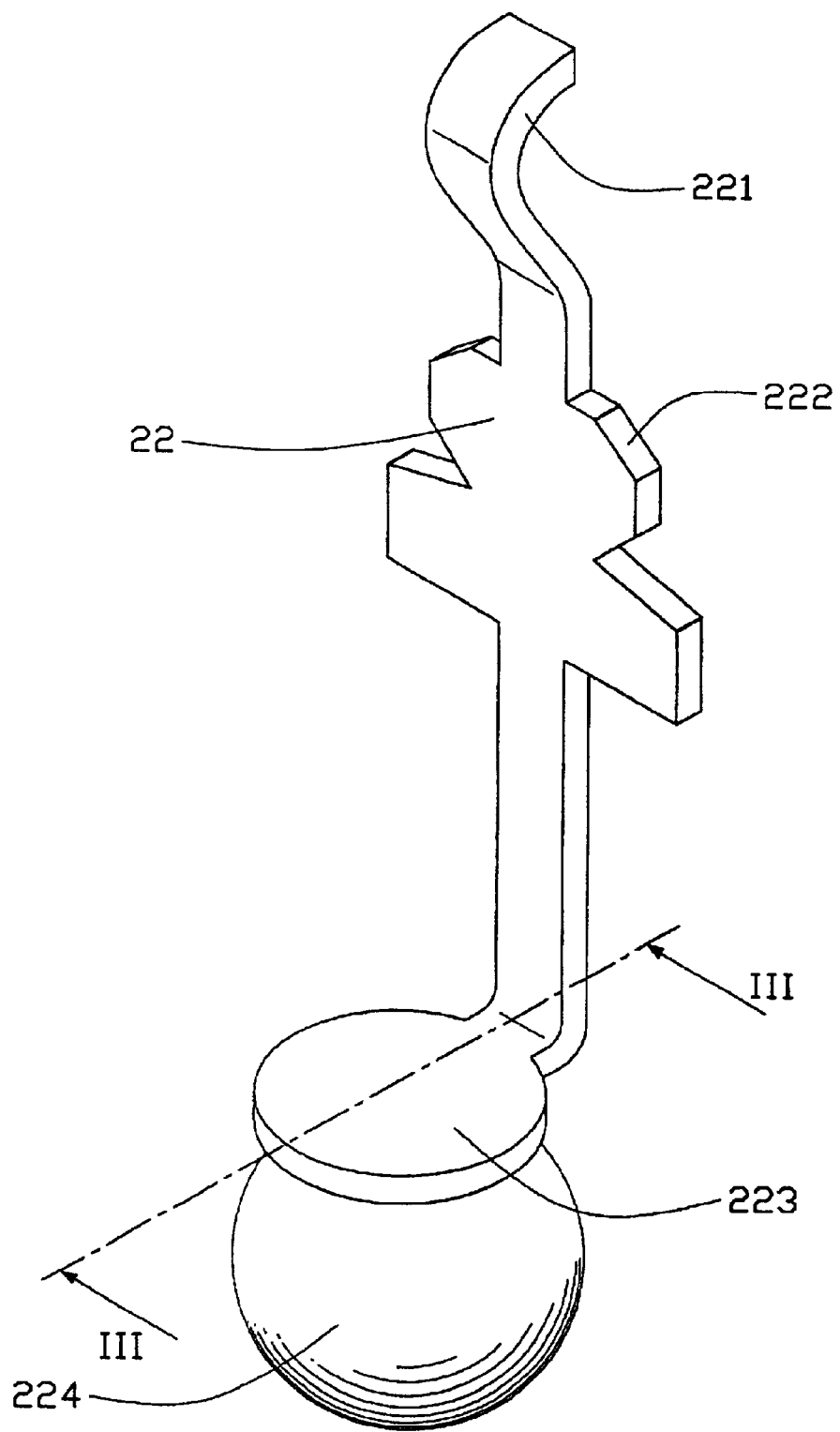
FIG. 2 is an isometric view of any one terminal of the electrical connector of FIG. 1.
Figure 3:
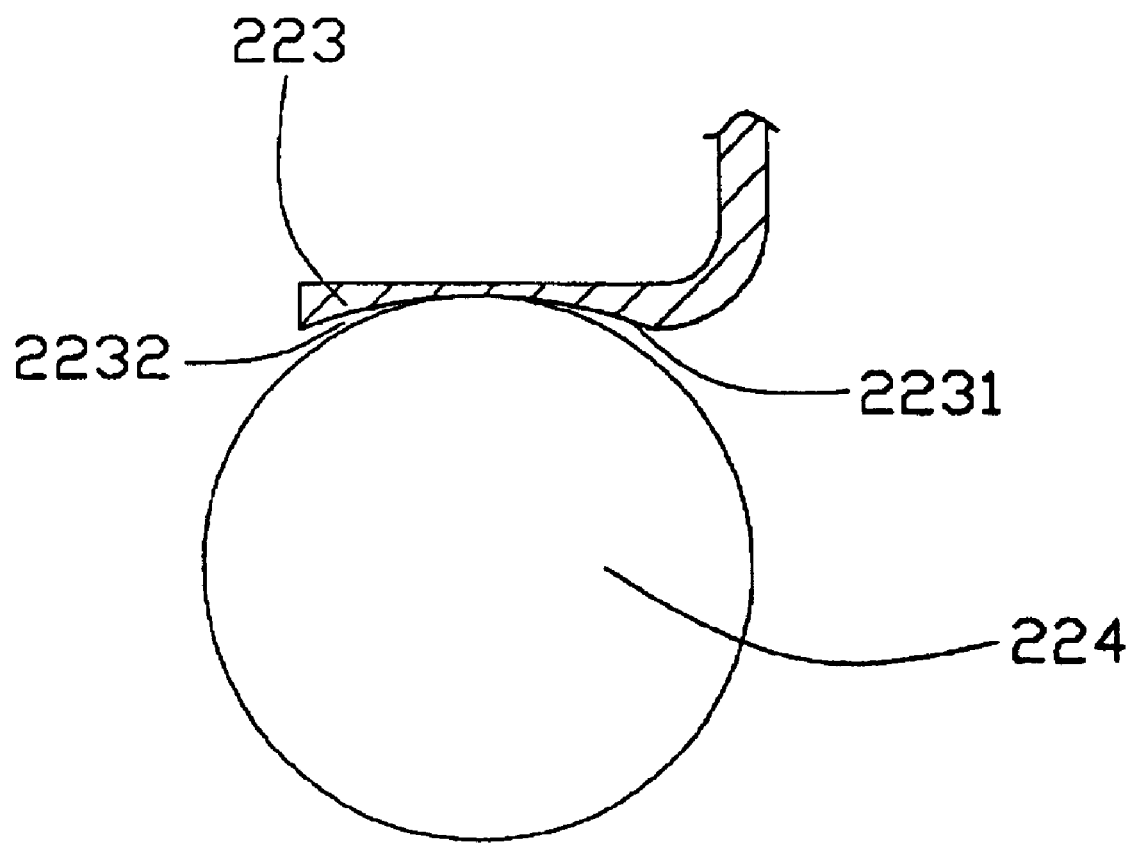
FIG. 3 is a schematic sectional view taken along line III—III of FIG. 2.

Referring to FIGS. 2 and 3, each terminal 22 comprises an upper contact portion 221 adapted to engage with a mating contact, an intermediate positioning portion 222, and a lower solder portion 223 adapted to receive a solder ball 224 fused thereon. The solder portion 223 is a circular pad for electrically connecting to a corresponding conductive pad of a printed circuit board (PCB)(not shown). An area of the solder portion 223 is substantially the same as an area of the conductive pad. A curved dimple 2232 is defined in a middle of a bottom of the solder portion 223. A largest cross-sectional area of the dimple 2232 is slightly less than the area of the solder portion 223. Thus the solder portion 223 has an indented solder surface 2231 facing the PCB.

Because the dimple 2232 is large, the indented solder surface 2231 has a large area that can contact the solder ball 224. Accordingly, the solder ball 224 can be easily positioned and held in the dimple 2232. Furthermore, when the solder ball 224 is soldered to the PCB, the melted solder ball 224 is apt to flow into the dimple 2232 rather than overflow out from the dimple 2232 and wick along the terminal 22. This ensures good signal transmitting characteristics of the terminal 22.

In alternative embodiments of the present invention, the dimple 2232 may have a variety of different shapes. For example, the dimple 2232 may be conical, dome-shaped, or have a trapezoidal cross-section.

While preferred embodiments in accordance with the present invention have been shown and described, equivalent modifications and changes known to persons skilled in the art according to the spirit of the present invention are considered within the scope of the present invention as defined in the appended claims.

What is claimed is:

1. An electrical connector for electrically connecting a central processing unit with a circuit board, the electrical connector comprising:

a base comprising a body having a multiplicity of electrical terminals received therein; and a cover engaged on the base;

wherein each of the terminals comprises a pad-shaped solder portion, a dimple is defined in a bottom surface of the solder portion to receive a block of heat-fusible material therein, and a largest cross-sectional area of the dimple is substantially the same as an area of the solder portion.

2. The electrical connector as claimed in claim 1, wherein the dimple is generally conical.

3. The electrical connector as claimed in claim 1, wherein the dimple is generally dome-shaped.

4. The electrical connector as claimed in claim 1, wherein the dimple has a generally trapezoidal cross-section.

5. The electrical connector as claimed in claim 1, wherein each of the terminals further comprises a contact portion adapted to engage with a mating contact, and a positioning portion interconnecting the solder portion with the contact portion.

6. An electrical terminal for use with an electrical connector, comprising:
- a contact portion adapted to engage with a mating contact; and
- a pad-shaped solder portion defining a dimple in a bottom surface thereof for receiving a block of heat-fusible material therein;
- wherein a largest cross-sectional area of the dimple is substantially the same as an area of the solder portion.

7. The electrical terminal as claimed in claim 6, wherein the dimple is generally conical.

8. The electrical terminal as claimed in claim 6, wherein the dimple is generally dome-shaped.

9. The electrical terminal as claimed in claim 6, wherein the dimple has a generally trapezoidal cross-section.

10. The electrical terminal as claimed in claim 6, further comprising a positioning portion interconnecting the solder portion with the contact portion.

11. An electrical terminal assembly for use with an electrical connector, comprising;
- a vertical positioning portion;
- a contact portion disposed above said positioning portion; and
- a horizontal cantilever type solder portion disposed below said positioning portion; wherein
- said solder portion defines a flat top surface and a dimple in an opposite bottom surface, said dimple being dimensioned to be large enough to almost occupy a whole area of said bottom surface.

12. The electrical terminal as claimed in claim 11, wherein said solder portion is in form of a circle.

13. The electrical terminal as claimed in claim 11, wherein a solder ball is attached to the bottom surface, and wherein a radius of said solder ball is smaller than that of the dimple before said solder ball is melted to be attached to the bottom surface.

* * * * *